United States Patent
Solum

(10) Patent No.: US 7,184,728 B2
(45) Date of Patent: Feb. 27, 2007

(54) DISTRIBUTED AUTOMATIC GAIN CONTROL SYSTEM

(75) Inventor: Jeff Solum, Deephaven, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 869 days.

(21) Appl. No.: 10/084,115

(22) Filed: Feb. 25, 2002

(65) Prior Publication Data

US 2003/0162516 A1    Aug. 28, 2003

(51) Int. Cl.
*H04B 7/00* (2006.01)
*H04B 1/06* (2006.01)

(52) U.S. Cl. .............................. 455/234.1; 455/232.1; 455/240.1; 455/277.1; 370/318; 370/400

(58) Field of Classification Search ............ 455/232.1, 455/234.1, 234.2, 236.1, 240.1, 241.1, 242.1, 455/277.1, 334, 335, 403, 138, 140; 370/334, 370/335, 431, 437, 455, 497, 400, 318
See application file for complete search history.

(56) References Cited

U.S. PATENT DOCUMENTS

| | | | |
|---|---|---|---|
| 5,752,170 A * | 5/1998 | Clifford | 455/126 |
| 6,535,720 B1 * | 3/2003 | Kintis et al. | 455/115.1 |
| 6,580,905 B1 * | 6/2003 | Naidu et al. | 455/522 |
| 6,799,020 B1 * | 9/2004 | Heidmann et al. | 455/103 |

* cited by examiner

*Primary Examiner*—Tony T. Nguyen
(74) *Attorney, Agent, or Firm*—Fogg & Powers, LLC; David N. Fogg

(57) ABSTRACT

A wireless distribution system includes a number of remote units distributed in a coverage area to receive wireless signals and to provide the signals through the distribution system to input ports of a node where the signals are combined, a number of input power monitors operatively connected to one or more of the input ports to determine power levels of signals received at the input ports, variable gain controllers to control signals received at some or all of the input ports, a node to combine a plurality of signals from the plurality of input ports, and a controller to provide control signals to control one or more of the variable gain controllers.

36 Claims, 2 Drawing Sheets

DISTRIBUTED AUTOMATIC GAIN CONTROL SYSTEM

TECHNICAL FIELD

The present invention is related to a high capacity distributed communications system, and more particularly to a distributed automatic gain control (AGC) system for use in a point-to-multipoint communication system in which wireless (radio frequency or otherwise) signals are distributed in buildings or other areas where wireless signal propagation is likely to be a problem.

BACKGROUND INFORMATION

The operational range of a system that combines and distributes signals within buildings or other areas where wireless signal propagation is likely to be a problem, whether the signals are digital or analog or some combination of both, is limited by the dynamic range handling capability of the system. In a distributed system, such as the one disclosed in U.S. patent application Ser. No. 09/619,431, "Point-To-Point Digital Radio Frequency Transport," filed on Jul. 19, 2000, incorporated herein by reference as if fully set forth, signals of varying levels are present at input ports, at signal combiners and at output ports. A large signal at a single input port may potentially saturate the output port (e.g., cause an overflow condition) if the large signal exceeds the dynamic range of the system and is not controlled in some way.

Even if a saturation level is not reached, a large signal may effectively limit the amount of traffic that the system can handle. For example, capacity in a spread spectrum system, such as a system employing a spreading function (for example, code division multiple access (CDMA), IEEE 802.11 complimentary code keying (CCK), or the like) is generally limited by the total amount of power allowed for all users in the bandwidth of interest in order to prevent unacceptable interference. Thus, power levels of spread spectrum mobile unit transmitters are continually adjusted to a level that is sufficient to maintain good signal reception at the base station but also minimizes signal power levels. For signals from mobile units that are supported by the distributed point-to-multipoint digital micro-cellular communication system (distributed communication system), power level adjustment works seamlessly. For example, if the signal from a supported mobile unit is boosted and provided to a base station, the base station will inform the mobile unit that its transmitter power should be correspondingly reduced. However, the frequency spectrum that is received, processed and distributed by the distributed communication system is shared by many services and devices and thus the distributed communication system will likely receive and process signals from communication services that are not supported by the system as well as from other sources of interference in the band. For example, the communications standard for wireless local networks, IEEE 802.11, calls for using the 2.4 GHz Industrial Scientific Medical (ISM) band. The 2.4 GHz ISM band has been called the "junk band" because it is contaminated by microwave oven emissions. Such non-supported and interfering signals may reach significant power levels in the coverage area and cause significant problems.

For example, a distributed communication system in a building or other enclosure may share a coverage area with a non-supported service. Further, the non-supported service may have mobile units in the coverage area that share the same bandwidth with the distributed communication system. Unfortunately, the mobile units from the non-supported service may transmit at much higher power levels compared to the distributed communication system to provide for good reception by the non-supported base station, which may be located a significant distance from the building or enclosure. This power level may be many orders of magnitude greater than signals from supported sources that are much closer to radio transceivers in the building or enclosure and may effectively "power limit" the capacity of the system or saturate the distributed communications system.

The above-mentioned problems with controlling the gain of wireless signals in distributed communication systems within buildings and other enclosed areas, as well as other problems, are addressed by the present invention and will be understood by reading and studying the following specification.

SUMMARY

A wireless distribution system according to one aspect of the present invention includes a plurality of remote units distributed in a coverage area to receive wireless signals in the coverage area and provide the signals to a plurality of input ports to receive signals comprising the signals provided by the plurality of remote units a plurality of input power monitors operatively connected to one or more of the plurality of input ports to determine power levels of signals received at the input port a plurality of variable gain controllers to control the gain of signals received at the one or more of the plurality of input ports in response to a control signal, a node to combine a plurality of signals from the plurality of input ports, and a controller to provide control signals to individually control each of the variable gain controllers.

DETAILED DESCRIPTION

In the following detailed description of the preferred embodiments, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1:
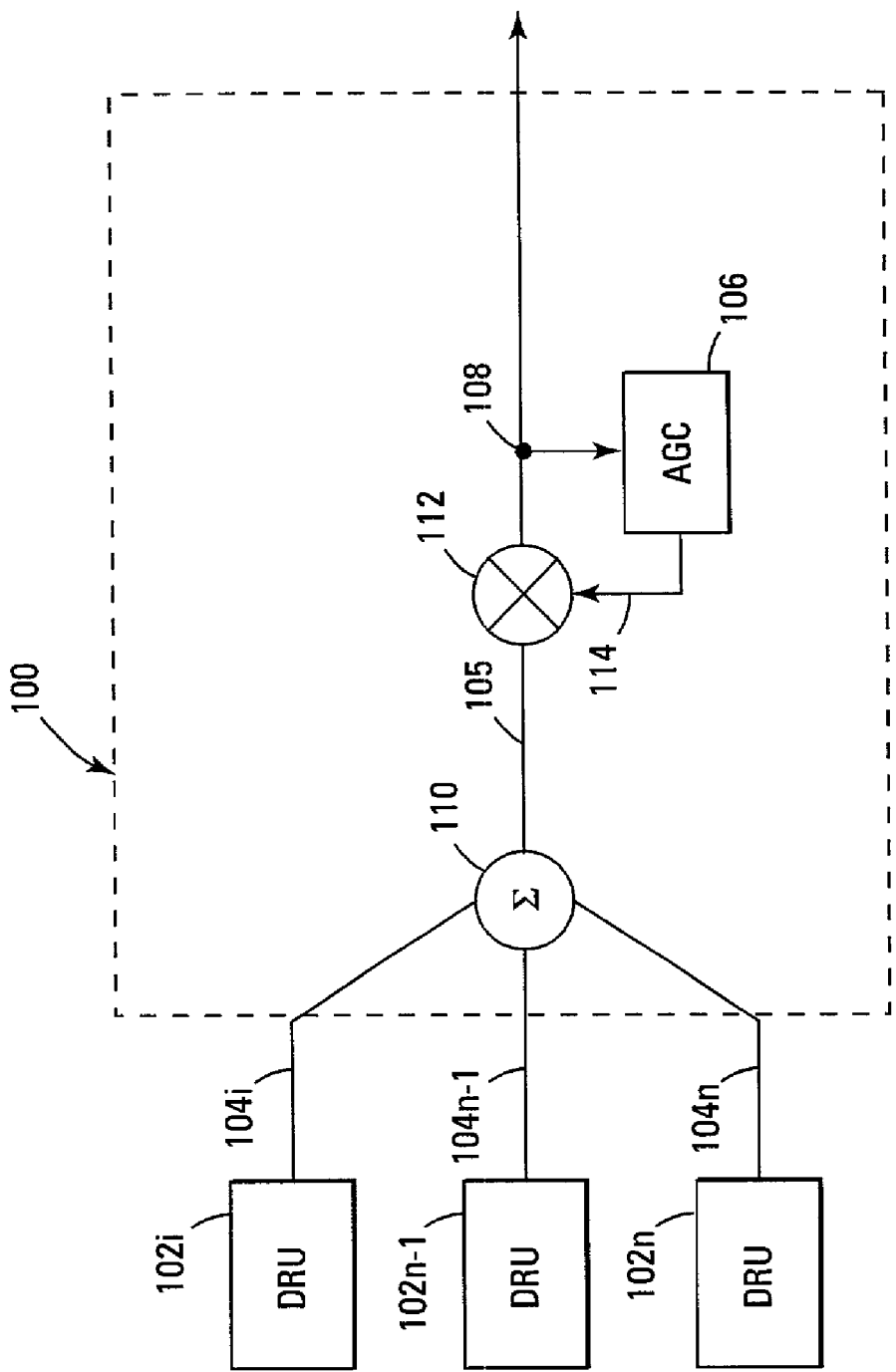
FIG. 1 is an illustration of one embodiment of an automatic gain control circuit according to the teachings of the present invention.

FIG. 1 is an illustration of a representative system 100 for distribution of wireless signals in a difficult environment for wireless signal propagation, such as in a large building or enclosure. The present invention is not limited to wireless signal propagation in and around buildings or other enclosures but is applicable to enhanced wireless systems for any coverage area. The system 100 includes a number of digital remote units (DRUs) $102_i$ to $102_n$ that receive a frequency spectrum of wireless signals such as may be transmitted by low power wireless devices in and around the building. In general, the DRUs process the spectrum of wireless signals so that the spectrum can be transmitted over transmission links $104_i$ to $104_n$, which may include one or more transmission media such as fiber optic, coaxial, twisted pair or simple copper wire, wireless link, or other medium of information transmission, and interface devices for such media or combinations thereof. The signals may be processed before, during and after transmission over the transmission links $104_i$ to $104_n$ to improve signal characteristics and propagation over the transmission media. Processing of the signals may include analog to digital conversion, analog and digital filtering, mixing and frequency translation, amplification and other well-known signal processing techniques. The transmission links $104_i$ to $104_n$ terminate at a node 110 where the signals are combined. Signals combined at node 110 can originate from the various DRUs 102 as well as from other upstream nodes such as digital extension units (DEUs), which also combine signals from DRUs or other DEUs.

In general, the frequency spectrum served by distribution system 100 is shared by a number of users and services. Users and services that are supported by distribution system 100 will usually be subject to and will abide by power control limitations of the system so that signal interference will not result from the use of excessive power. However, not all of the users and services sharing the frequency spectrum are supported by distribution system 100 and some of the signals, particularly those that are not subject to the power control limitations imposed by supported services may reach sufficient amplitude such that they may interfere with signals supported by the distribution system. This is particularly likely if strong signals are broadcast in close proximity to a receiving unit such as DRUs $102_i$ to $102_n$. The distributed wireless communication system has a limited dynamic range and accordingly must be protected from signals that would saturate or otherwise exceed the dynamic range handling capability of the system.

One example of an AGC circuit for use in a distributed communication system according to the present invention is shown in FIG. 1. DEU 100 includes a node 110 for summing signals received on transmission links $104_i$ to $104_n$. AGC circuit 106 is inserted upstream of node 110 in order to protect the transmission system from reaching saturation levels. AGC circuit 106 senses a power level at power sensor 108 in transmission link 105 and feeds back a gain control signal by control 114 to node 112 where gain control is applied to the summed signals on transmission link 105. In this way, gain control is provided upstream from node 110 so that an overflow condition is avoided. While the system of FIG. 1 shows only one DEU, it should be understood that many such DEUs may be included in a large distributed communication system.

Figure 2:
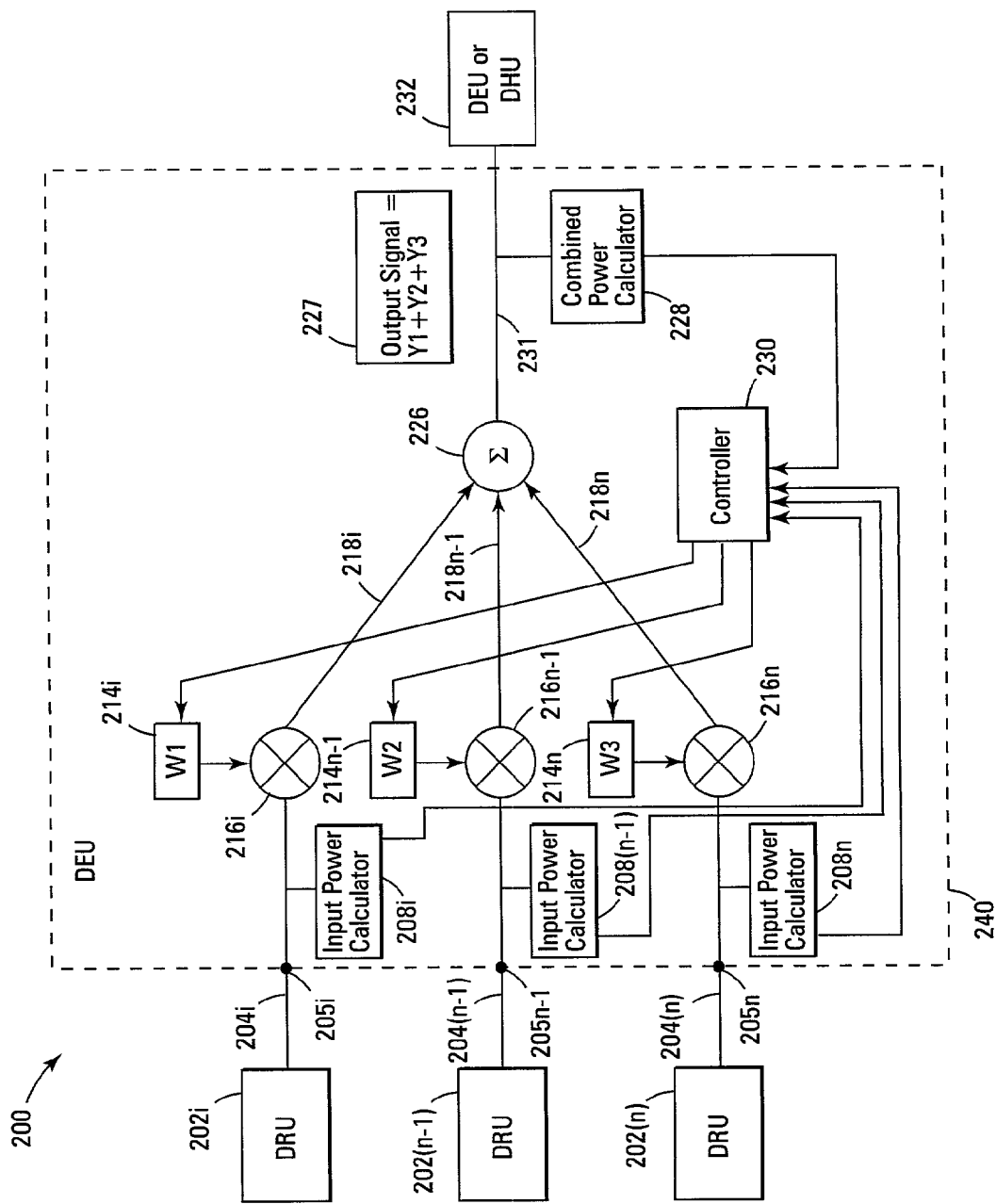
FIG. 2 is a block diagram of one embodiment of a distributed automatic gain control for a distributed communication system according to the teachings of the present invention.

FIG. 2 is an illustration of one additional example of a distributed automatic gain system 200 according to the present invention. System 200 controls the gain of signals distributed in a multiple point to point wireless system to enhance signal coverage, particularly in areas such as buildings and other enclosures where wireless signal coverage is a problem. The system 200 includes a number of digital remote units $202_i$ to $202_n$ that receive wireless signals and process them for delivery upstream over transmission links $204_i$ to $204_n$. In general such transmission links may be fiber optic, coaxial, twisted pair, wireless, or other medium of information transmission, or combination thereof. Each DRU $202_i$ to $202_n$ includes an input port or receiver that receives, processes and digitizes a wireless bandwidth. In one example each DRU receives the same wireless bandwidth. The DRUs $202_i$ to $202_n$ transmit the digitized signals upstream to a digital expansion unit (DEU) or to a digital host unit (DHU) represented by summing junction 226. Summing junction 226 sends the summed digitized signals to another DEU or a digital host unit 228 (DHU) located further upstream.

DEU 240 has a number of input ports $205_i$ to $205_n$ for receiving transmission links $204_i$ to $204_n$ from each DRU or DEU located upstream from DEU 240. Each input port $205_i$ to $205_n$ has associated with it an input power level calculator $208_i$ to $208_n$ to determine power levels of signals received over transmission links $204_i$ to $204_n$. The input power level calculators $208_i$ to $208_n$ provide power level signals to controller 230. Controller 230, which may be a dedicated controller or part of a larger system-wide controller, determines weights for gain control of the distribution system. Controller 230 determines weights $214_i$ to $214_n$ for individually controlling the gain of signals received over transmission links $204_i$ to $204_n$ at multipliers $216_i$ to $216_n$ so that the signals do not exceed a predetermined threshold level. The gain controlled signals are then provided to node 226 via transmission links $218_i$ to $218_n$. Node 226 digitally sums the signals from transmission links $218_i$ to $218_n$. Combined power level calculator 228 determines the power level of the signals combined at node 226 and provides the combined power level signal to controller 230. The combined signals are then transmitted upstream via transmission link 231 to DHU or DEU 232. Output signal 227 on transmission link 231 is the combined signals of $218_i$ to $218_n$. If the combined power level calculator 228 sees a combined signal power that exceeds a predetermined level, then the coefficients $214_i$ to $214_n$ are set by controller 230 and assigned based on the Power Calculators $208_i$ to $208_n$. The weights of coefficients $214_i$ to $214_n$ are set by the controller based on the individual input power calculators $208_i$ to $208_n$. Thus, the smaller the input signal the larger the corresponding weighted coefficient.

When the signal, 231, at Power Calculator 228 is lower than a predetermined "decay threshold", the weighted coefficients $214_i$ to $214_n$ are increased over time based on a decay time constant and a fair weighting based on input Power calculators $208_i$ to $208_n$ is applied to the input signals $204_i$ to $204_n$ until a satisfactory power level is achieved at combined power calculator 228. Conversely, when the signal, 231, at combined power calculator 228 is higher than a predetermined "attack threshold," the weighted coefficients $214_i$ to $214_n$ are decreased over time based on an attack time constant and a fair weighting based on input Power calculators $208_i$ to $208_n$ is applied to the input signals $204_i$ to $204_n$ until a satisfactory power level is achieved at combined power calculator 228.

Operation of one example of a distributed AGC system according to the present invention will now be described. While the system of FIG. 2 shows only one DEU, many such DEUs may be included in a large distributed communication system.

The weighted coefficients $214_i$ to $214_n$ are initially set to provide a minimum attenuation level of the combined signals on transmission link 231. When the level of the combined signals on transmission link 231 exceeds a predetermined threshold as determined by combined power level calculator 228, controller 230 which signal or signals exceed a threshold level and will attenuate those signals so that the combined power at 228 avoids an overflow condition at the node. Signal levels at each input port $205_i$ to $205_n$ are monitored and evaluated by input power calculators $208_i$ to $208_n$ to determine whether any transmission link $204i$ to $204n$ is providing a signal that exceeds a predetermined level. If one or more of the input power calculators $208_i$ to $208_n$ reports a signal level that exceeds the threshold, signals from those input ports will be gain controlled by adjusting weights $214_i$ to $214_n$ until all input signal levels are at or below a level such that an overflow condition is avoided. The thresholding and gain control process may be duplicated at other DEUs upstream or downstream from node 226 so Monitoring of the signal levels at the input ports may take place continuously or may be triggered only after combined power calculator 228 senses a combined signal level that warrants a change in gain control of the combined signals at the node. Alternatively, signal levels at the input ports may be polled periodically to determine whether signal levels may have changed.

In one additional example of the present invention, a frequency selective attenuation device such as an adaptive filter may be used to attenuate only those frequencies at which the offending signals are found. This may be preferable in applications where the interfering signals are confined to specific frequencies and other desirable signals would be lost if the overall gain of signals from one or more DRUs were controlled. In another example, combined power calculator 228 may be eliminated entirely and distributed AGC performed by adjusting the gain of the signals received upstream from the DRUs. Of course, an AGC unit would be required for each DRU and for each signal path in which signal gain might increase by interference, amplification or otherwise.

CONCLUSION

A distributed wireless AGC system has been described. The distributed wireless AGC system includes a number of remote units distributed in a coverage area to receive wireless signals in the coverage area, a number of input ports to receive signals from the remote units, input power monitors operatively connected to each of the input ports to determine power levels of signals received at each input port, variable gain controllers to control the gain of signals received at each of the input ports in response to a control signal, a node to combine a plurality of signals from the plurality of input ports, a combined power monitor to determine power levels of the signals combined at the node, a controller to provide control signals to control the gain of each of the variable gain controllers based on a weighting function that is proportional to power received at each input port, as determined by the input power monitors such that the combined power as determined by the combined power monitor does not exceed a predetermined level.

Although specific embodiments have been illustrated and described herein, it will be appreciated by those of ordinary skill in the art that any arrangement which is calculated to achieve the same purpose may be substituted for the specific embodiments shown. For example, DHUs and DEUs are not limited to the receipt, gain control of and summing, splitting and transmitting of digitized wireless signals. In some examples of the present invention, DHUs and DEUs are capable of receiving, processing, gain controlling and summing analog wireless signals in addition to or instead of digitized wireless signals. As well, DHUs and DEUs may be capable of splitting, processing and transmitting analog wireless signals in addition to or instead of digitized wireless signals. This application is intended to cover any adaptations or variations of the present invention. Therefore, it is intended that this invention be limited only by the claims and the equivalents thereof.

What is claimed is:

1. A wireless distribution system, comprising:
   a plurality of remote units distributed in a coverage area to receive upstream supported and non-supported wireless signals;
   a plurality of input ports to receive signals comprising the wireless signals provided by the plurality of remote units;
   a plurality of input power monitors operatively connected to one or more of the plurality of input ports to determine power levels of signals received at the input ports;
   a plurality of variable gain controllers to control the gain of signals received at the one or more of the plurality of input ports in response to a plurality of corresponding control signals;
   a node to combine a plurality of signals from the plurality of input ports; and
   a controller to provide the plurality of corresponding control signals to individually control each of the variable gain controllers.

2. The wireless distribution system of claim 1, wherein the controller provides control signals based on a weighting function.

3. The wireless distribution system of claim 2 wherein the weighting function is proportional to power levels determined by the input power monitors such that a combined power does not exceed a predetermined level.

4. The wireless distribution system of claim 2 further comprising a combined power monitor to determine the combined power level of signals combined at the node.

5. The wireless distribution system of claim 1, wherein the plurality of input power monitors are operatively connected to the plurality of input ports to determine power levels of signals received at the input ports so that an upstream combined signal level does not exceed a predetermined level.

6. The wireless distribution system of claim 1, wherein the signals received at the input ports comprise a frequency spectrum that is digitized for distribution over the wireless distribution system.

7. The wireless distribution system of claim 6 wherein the digitized wireless spectrum is transmitted, at least in part, over a fiber optic transmission line.

8. The wireless distribution system of claim 1, wherein one or more of the variable gain controllers comprises a filter.

9. The wireless distribution system of claim 1, wherein the filter comprises an adaptive filter.

10. The wireless distribution system of claim 1, further comprising a transmission link to transmit the signals combined at the node to at least one upstream node where the combined signals may be further combined with other signals.

11. The wireless distribution system of claim 10 further comprising at least one combined power monitor operatively connected to an output of the upstream node to monitor the power level of the signals combined at the at least one upstream node and
   at least one variable gain controller to control the power level of signals input to at least one upstream node such that the power level at the upstream node does not exceed a predetermined level.

12. A method for controlling the signal levels of a wireless distribution system, the method comprising:

receiving upstream supported and non-supported wireless signals at a plurality of remote units distributed in a coverage area;

providing signals from the remote units to a plurality of input ports;

monitoring input power levels of the signals received at one or more of the plurality of input ports;

combining signals from the plurality of input ports at a node;

determining individual control signals for each of the input ports based on a weighting function that is proportional to the monitored input power levels such that the combined power does not exceed a predetermined level, and gain controlling the signals received at the input ports in response to the control signals.

13. The method of claim 12 further comprising monitoring the combined power level of signals combined at the node.

14. A method for controlling the signal levels of a wireless distribution system, the method comprising:

receiving upstream supported and non-supported wireless signals at a plurality of remote units distributed in a coverage area;

providing signals from the remote units to a plurality of input ports;

monitoring the input power level of the signals received at each of the input ports;

controlling the gain of the signals received at each of the input ports in response to a control signal;

combining the signals from the plurality of input ports at a node;

monitoring power levels of the combined signals;

determining weights for a weighting function that is proportional to power received at each input port, as determined by the input power monitors such that the power of the combined signals does not exceed a predetermined level; and providing the control signals to each input port based on the weighting function.

15. A wireless distribution system, comprising:

a plurality of remote units distributed in a coverage area to receive upstream supported and non-supported wireless signals and to provide the wireless signals through the distribution system to one or more input ports;

a plurality of input power monitors operatively connected to the one or more input ports to determine power levels of the wireless signals received at the input port;

a plurality of variable gain controllers to control the gain of the wireless signals received at the one or more input ports based on a predetermined threshold wherein a saturation level is not reached.

16. A wireless distribution system comprising:

a plurality of remote units distributed in a coverage area to receive upstream supported and non-supported wireless signals and to provide the wireless signals through the distribution system to one or more input ports;

a plurality of input power monitors operatively connected to one or more of the input ports to determine power levels of the wireless signals received at the input ports;

a plurality of variable gain controllers to control the gain of the wireless signals received at one or more of the input ports;

a node to combine the wireless signals from the plurality of input ports;

a combined power monitor to determine a power level of the signals combined at the node; and a controller to provide control signals to control one or more of the variable gain controllers so that an overflow condition does not occur at the node.

17. The wireless distribution system of claim 16, wherein the signals are converted to digital signals before such signals are combined at the node.

18. A method for controlling the signal levels of a wireless distribution system, the method comprising:

receiving a spectrum of upstream supported and non-supported wireless signals at a plurality of remote units distributed in a coverage area;

digitizing the received signals;

transmitting the digitized signals over one or more transmission links to a plurality of input ports operatively connected to a node where the signals are combined;

monitoring input power kvels of the signals received at one or more of the plurality of input ports;

monitoring the combined power level of the signals combined at the node;

determining individual control signals for controlling the signal levels of each of the input ports based on a weighting function that is proportional to the monitored input power levels such that the combined power as determined by the combined power monitor does not exceed a predetermined level, and attenuating the signals received at each of the input ports in response to the control signals.

19. The method of claim 18 further comprising transmitting the signals combined at the node to at least one upstream node where the combined signals are further combined with other signals.

20. The method of claim 19 further comprising monitoring the combined power level of the signals combined at the at least one upstream node;

determining individual control signals for controlling the signal levels of each of the signals supplied to input ports of the at least one upstream node based on a weighting function that is proportional to the monitored power levels of such signals such that the combined power as determined by a combined power monitor for the at least one upstream node does not exceed a predetermined level, and controlling the gain of the signals supplied to one or more input ports to the upstream node in response to the control signals.

21. The method of claim 20, whereih controlling the gain of the signals supplied to one or more input ports comprises filtering.

22. The method of claim 21, wherein the filtering comprises adaptive filtering.

23. A digital expansion unit, comprising:

a plurality of input ports to receive signals comprising upstream supported and non-supported signals from a plurality of digital remote units distributed in a coverage area;

a node to digitally combine signals from the input ports;

a plurality of input power monitors operatively connected to one or more of the input ports to determine the level of signals received at the input ports, a plurality of gain controllers to adjust the gain of signals received at some or all of the input ports;

a combined power monitor to determine the combined signal level of signals combined at the node; and a controller to provide control signals to control one or more of the gain controllers wherein an overflow condition is avoided for signals combined at the node.

24. A wireless distribution system comprising one or more digital expansion units, the digital expansion units comprising:
- a plurality of input ports to receive signals comprising upstream supported and non-supported signals from a plurality of digital remote units distributed in a coverage area;
- a node to digitally combine signals from the input ports;
- a plurality of input power monitors operatively connected to one or more of the input ports to determine the level of signals received at the input ports,
- a plurality of gain controllers to adjust the gain of signals received at some or all of the input ports;
- a combined power monitor to determine the combined signal level of signals combined at the node; and
- a controller to provide control signals to control one or more of the gain controllers wherein an overflow condition is avoided for signals combined at the node.

25. A wireless distribution system, comprising:
- a plurality of remote units distributed in a coverage area to receive upstream supported and non-supported wireless signals in the coverage area;
- a node to combine a plurality of wireless signals from one or more of the plurality of remote units;
- a power monitor to determine a power level of the wireless signals combined at the node; and a variable gain controller to control the gain of the signals combined at the node.

26. The wireless distribution system of claim 25, wherein the signals received at the plurality of remote units comprise a frequency spectrum that is digitized for distribution over the wireless distribution system.

27. The wireless distribution system of claim 26 wherein the digitized wireless spectrum is transmitted, at least in part, over a fiber optic transmission line.

28. The wireless distribution system of claim 25, wherein the variable gain controller comprises a filter.

29. The wireless distribution system of claim 28, wherein the filter comprises an adaptive filter.

30. The wireless distribution system of claim 25, further comprising a transmission link to transmit the signals combined at the node to at least one upstream node where the combined signals may be further combined with other wireless signals.

31. The wireless distribution system of claim 30 further comprising a power monitor operatively connected to an output of the at least one upstream node to monitor the power level of the signals combined at the upstream node; and
- a variable gain controller to control the power level of signals combined at the at least one upstream node such that the output power level at the upstream node does not exceed a predetermined level.

32. A method for controlling the signal levels of a wireless distribution system, the method comprising:
- receiving a spectrum of upstream supported and non-supported wireless signals at a plurality of remote units distributed in a coverage area;
- digitizing the received signals;
- transmitting the digitized signals over one or more transmission links to a node where the signals are combined;
- monitoring the power level of the combined signals at the node; and
- controlling the gain of the combined signals in response to the monitored power level.

33. The method of claim 32 further comprising transmitting the signals combined at the node to at least one upstream node where the combined signals are farther combined with other wireless signals.

34. The method of claim 33 further comprising monitoring the power level of the signals combined at the at least one upstream node; and
- controlling the gain of the signals combined at the at least one upstream node in response to the monitored power level.

35. The method of claim 34 wherein controlling the gain of the signals comprises digital filtering.

36. The method of claim 35 wherein the filtering comprises adaptive filtering.

* * * * *

UNITED STATES PATENT AND TRADEMARK OFFICE
CERTIFICATE OF CORRECTION

PATENT NO. : 7,184,728 B2 Page 1 of 1
APPLICATION NO. : 10/084115
DATED : February 27, 2007
INVENTOR(S) : Solum It is certified that error appears in the above-identified patent and that said Letters Patent is hereby corrected as shown below:

At Claim 18, Column 8, Line 16, replace "kvels" with --levels--

At Claim 33, Column 10, Line 27, replace "farther" with --further--

Signed and Sealed this

Twenty-fifth Day of November, 2008

JON W. DUDAS
*Director of the United States Patent and Trademark Office*